(12) United States Patent
Khlat

(10) Patent No.: US 10,875,765 B2
(45) Date of Patent: Dec. 29, 2020

(54) MICROELECTROMECHANICAL SYSTEMS (MEMS) SWITCHING CIRCUIT AND RELATED APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 72 days.

(21) Appl. No.: 16/191,841

(22) Filed: Nov. 15, 2018

(65) Prior Publication Data

US 2019/0367356 A1 Dec. 5, 2019

Related U.S. Application Data

(60) Provisional application No. 62/680,306, filed on Jun. 4, 2018.

(51) Int. Cl.
| | |
|---|---|
| *H03F 3/189* | (2006.01) |
| *H03F 1/02* | (2006.01) |
| *H03F 1/52* | (2006.01) |
| *B81B 7/02* | (2006.01) |

(52) U.S. Cl.
CPC ............... *B81B 7/02* (2013.01); *H03F 1/02* (2013.01); *H03F 3/189* (2013.01); *B81B 2201/01* (2013.01); *B81B 2207/03* (2013.01); *H03F 2200/451* (2013.01); *H03F 2200/541* (2013.01)

(58) Field of Classification Search
USPC ............................................. 330/207 P, 298
See application file for complete search history.

(56) References Cited

U.S. PATENT DOCUMENTS 8,942,644 B2* 1/2015 Schell .................. H04B 1/0064
361/13

\* cited by examiner

*Primary Examiner* — Hieu P Nguyen
(74) *Attorney, Agent, or Firm* — Withrow & Terranova, P.L.L.C.

(57) ABSTRACT

A microelectromechanical systems (MEMS) switching circuit and related apparatus is provided. In examples discussed herein, the MEMS switching circuit is configured to toggle (open or close) a number of MEMS switches without causing hot switching in any of the MEMS switches. More specifically, the MEMS switching circuit determines a switching sequence for toggling the MEMS switches such that each MEMS switch is only opened or closed under a very low current (e.g., <0.1 mA) or a very low voltage (e.g., <0.1 V). By operating the MEMS switches based on the determined switching sequence, it may be possible to protect the MEMS switches from hot switching damage, thus making it possible to employ the MEMS switches in an apparatus (e.g., a wireless communication device) to replace conventional switches for improved power amplifier efficiency and radio frequency (RF) performance.

20 Claims, 4 Drawing Sheets

MICROELECTROMECHANICAL SYSTEMS (MEMS) SWITCHING CIRCUIT AND RELATED APPARATUS

RELATED APPLICATIONS

This application claims the benefit of U.S. Provisional Patent Application Ser. No. 62/680,306, filed on Jun. 4, 2018, the disclosure of which is incorporated herein by reference in its entirety.

FIELD OF THE DISCLOSURE

The technology of the disclosure relates generally to operating microelectromechanical systems (MEMS) switches in an electrical circuit.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE) and fifth-generation new-radio (5G-NR). In this regard, a mobile communication device may need to operate in a variety of operation modes, such as multiple-input multiple-output (MIMO) spatial diversity, MIMO spatial multiplexing, and/or radio frequency (RF) beamforming. In addition, it may be necessary for the mobile communication device to communicate an RF signal(s), either concurrently or alternately, in different RF bands associated with different wireless communication technologies. As such, the mobile communication device may include a number of RF filters for communicating the RF signal(s) in different RF bands. Accordingly, the mobile communication device may employ a number of switches to toggle the RF signal(s) between different RF filters in different operation modes.

Notably, a conventional switch, such as a silicon-on-insulator (SOI) switch, may create a relatively higher on-resistance ($R_{ON}$) when the conventional switch is closed and a relatively higher off-capacitance ($C_{OFF}$) when the conventional switch is opened. Accordingly, the conventional switch may suffer a degraded figure-of-merit (FOM) (FOM=$R_{ON} \times C_{OFF}$) and cause unwanted insertion loss to degrade RF efficiency and/or performance of the mobile communication device. In contrast, a microelectromechanical systems (MEMS) switch typically has a FOM that is at least ⅓ lower than the FOM of the conventional SOI switch. As a result, it may be possible to reduce the unwanted insertion loss associated with the conventional SOI switch by replacing the conventional SOI switch with the MEMS switch, thus helping to improve RF efficiency and/or performance of the mobile communication device.

However, an MEMS switch may be susceptible to permanent damage of contact materials in the MEMS switch when the MEMS switch is toggled under a "hot switching" condition, which occurs when the MEMS switch is opened or closed while an electrical current and/or a voltage is present across the MEMS switch. As such, it may be desirable to replace conventional SOI switches with MEMS switches in the mobile communication device and configure the mobile communication device to prevent hot switching in the MEMS switches.

SUMMARY

Aspects disclosed in the detailed description include a microelectromechanical systems (MEMS) switching circuit and related apparatus. In examples discussed herein, the MEMS switching circuit is configured to toggle (open or close) a number of MEMS switches without causing hot switching in any of the MEMS switches. More specifically, the MEMS switching circuit determines a switching sequence for toggling the MEMS switches such that each MEMS switch is only opened or closed under a very low current (e.g., <0.1 mA) or a very low voltage (e.g., <0.1 V). By operating the MEMS switches based on the determined switching sequence, it may be possible to protect the MEMS switches from hot switching damage, thus making it possible to employ the MEMS switches in an apparatus (e.g., a wireless communication device) to replace conventional switches for improved power amplifier efficiency and radio frequency (RF) performance.

In one aspect, an MEMS switching circuit is provided. The MEMS switching circuit includes at least one first MEMS switch coupled between at least one first coupling node and an output node. The MEMS switching circuit also includes at least one second MEMS switch coupled between at least one second coupling node and the output node in parallel to the at least one first MEMS switch. The MEMS switching circuit also includes protection circuitry comprising at least one protection MEMS switch coupled between the at least one first coupling node and the at least one second coupling node. The MEMS switching circuit also include a controller configured to toggle at least one selected MEMS switch among the at least one first MEMS switch and the at least one second MEMS switch without causing hot switching in the at least one first MEMS switch, the at least one second MEMS switch, and the at least one protection MEMS switch.

In another aspect, an apparatus is provided. The apparatus includes an amplifier circuit configured to amplify an RF signal based on a modulated voltage. The apparatus also includes an MEMS switching circuit coupled to the amplifier circuit. The MEMS switching circuit includes at least one first MEMS switch coupled between at least one first coupling node and an output node. The MEMS switching circuit also includes at least one second MEMS switch coupled between at least one second coupling node and the output node in parallel to the at least one first MEMS switch. The MEMS switching circuit also includes protection circuitry comprising at least one protection MEMS switch coupled between the at least one first coupling node and the at least one second coupling node. The MEMS switching circuit also includes a controller configured to toggle at least one selected MEMS switch among the at least one first MEMS switch and the at least one second MEMS switch without causing hot switching in the at least one first MEMS switch, the at least one second MEMS switch, and the at least one protection MEMS switch.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIG. 1 is a schematic diagram of an exemplary microelectromechanical systems (MEMS) switching circuit configured to toggle (open/close) a number of MEMS switches without causing hot switching in any of the MEMS switches.

DETAILED DESCRIPTION

Figure 1:
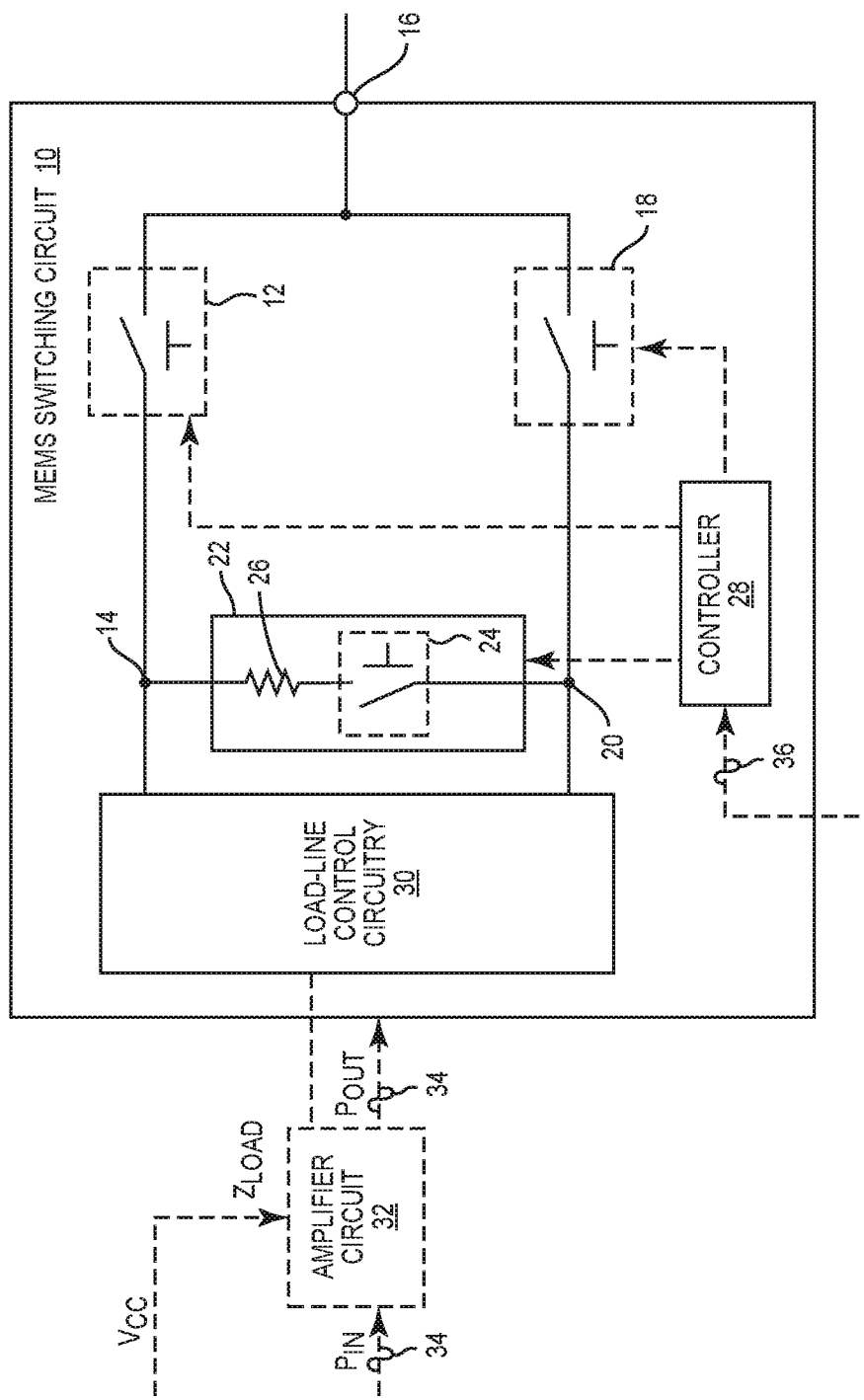

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a microelectromechanical systems (MEMS) switching circuit and related apparatus. In examples discussed herein, the MEMS switching circuit is configured to toggle (open or close) a number of MEMS switches without causing hot switching in any of the MEMS switches. More specifically, the MEMS switching circuit determines a switching sequence for toggling the MEMS switches such that each MEMS switch is only opened or closed under a very low current (e.g., <0.1 mA) or a very low voltage (e.g., <0.1 V). By operating the MEMS switches based on the determined switching sequence, it may be possible to protect the MEMS switches from hot switching damage, thus making it possible to employ the MEMS switches in an apparatus (e.g., a wireless communication device) to replace conventional switches for improved power amplifier efficiency and radio frequency (RF) performance.

In this regard, FIG. 1 is a schematic diagram of an exemplary MEMS switching circuit 10 configured to toggle (open/close) a number of MEMS switches without causing hot switching in any of the MEMS switches. As discussed in detail below, the MEMS switching circuit 10 is configured to only toggle (e.g., open-to-close or close-to-open) an MEMS switch when an electrical current across the MEMS switch is very low (e.g., <0.1 mA) and/or when a voltage across the MEMS switch is very low (e.g., <0.1 V) to avoid hot switching in the MEMS switch. Further, the MEMS switching circuit 10 is configured to toggle multiple MEMS switches based on a determined switching sequence to avoid hot switching in any of the MEMS switches. As such, it may be possible to protect the MEMS switch from potential damage caused by hot switching, thus making it possible to replace conventional switches (e.g., SOI switches) with MEMS switches in an apparatus (e.g., a wireless communication device) for improved power amplifier efficiency and radio frequency (RF) performance.

The MEMS switching circuit 10 includes at least one first MEMS switch 12 coupled between at least one first coupling node 14 and an output node 16. The MEMS switching circuit 10 also includes at least one second MEMS switch 18 coupled between at least one second coupling node 20 and the output node 16 in parallel to the first MEMS switch 12. Notably, the first MEMS switch 12 and the second MEMS switch 18 are discussed herein as a non-limiting example and should not be considered as being limiting. It should be appreciated that the MEMS switching circuit 10 may be configured to include additional MEMS switches without altering the operational principles discussed herein.

The MEMS switching circuit 10 can be configured to include protection circuitry 22 that is coupled between the first coupling node 14 and the second coupling node 20. In a non-limiting example, the protection circuitry 22 includes at least one protection MEMS switch 24 and at least one protection resistor 26 coupled in series between the first coupling node 14 and the second coupling node 20. In a non-limiting example, the protection MEMS switch 24 has a smaller footprint and a higher resistance than the first MEMS switch 12 and the second MEMS switch 18.

The MEMS switching circuit 10 can be configured to include a controller 28, such as a microprocessor, a microcontroller, a digital signal processor (DSP), or a field-programmable gate array (FPGA), for example. The controller 28 is configured to determine a switching sequence for toggling the first MEMS switch 12, the second MEMS switch 18, and the protection MEMS switch 24. More importantly, the controller 28 is configured to determine the switching sequence such that the first MEMS switch 12, the second MEMS switch 18, and the protection MEMS switch 24 are toggled sequentially with the very low current and/or the very low voltage to help avoid hot switching. As a result, it may be possible to toggle at least one selected MEMS switch among the first MEMS switch 12 and the second MEMS switch 18 without causing hot switching in the first MEMS switch 12, the second MEMS switch 18, and the protection MEMS switch 24.

In one non-limiting example, the controller 28 is configured to toggle the first MEMS switch 12 from closed to open and toggle the second MEMS switch 18 from opened to closed. In this regard, the controller 28 may determine the switching sequence that includes four transition phases.

In the first transition phase, the controller 28 first closes the protection MEMS switch 24. Notably, the second MEMS switch 18 remains open when the protection MEMS switch 24 is closed. As such, a voltage across the protection MEMS switch 24 would be very low (e.g., <0.1 V). As a result, the protection MEMS switch 24 can be closed without causing hot switching. In addition, the protection resistor 26 may help limit arc current flowing through the protection MEMS switch 24 even if the voltage across the protection MEMS switch 24 is greater than 0.1 V.

In the second transition phase, the controller 28 closes the second MEMS switch 18. Given that the protection MEMS switch 24 is closed and the first MEMS switch 12 remains closed, a voltage across the second MEMS switch 18 may be very low (e.g., <0.1 V). As such, the second MEMS switch 18 may be closed without causing hot switching.

In the third transition phase, the controller 28 opens the first MEMS switch 12. Given that the protection MEMS switch 24 and the second MEMS switch 18 are both closed to draw a larger amount of current, a current flowing through the first MEMS switch 12 may be very low (e.g., <0.1 mA). Accordingly, a voltage across the first MEMS switch 12 may be very low (e.g., <0.1 V) as well. As such, the first MEMS switch 12 may be opened without causing hot switching.

In the fourth transition phase, the controller 28 opens the protection MEMS switch 24. Given that the protection resistor 26 limits the arc current flowing through the protection MEMS switch 24, the protection MEMS switch 24 can be opened without causing hot switching.

In another non-limiting example, the controller 28 is configured to toggle the first MEMS switch 12 from opened to closed and toggle the second MEMS switch 18 from closed to open. In this regard, the controller 28 may determine the switching sequence that includes four transition phases.

In a first transition phase, the controller 28 closes the protection MEMS switch 24. In a second transition phase, the controller 28 closes the first MEMS switch 12. In a third transition phase, the controller 28 opens the second MEMS switch 18. In a fourth transition phase, the controller 28 opens the protection MEMS switch 24. According to the discussions above, each of the first MEMS switch 12, the second MEMS switch 18, and the protection MEMS switch 24 may be toggled with very low current and/or very low voltage to avoid hot switching.

The MEMS switching circuit 10 may include load-line control circuitry 30 coupled to the first coupling node 14 and the second coupling node 20 in parallel to the protection circuitry 22. The load-line control circuitry 30 may be coupled to an amplifier circuit 32 configured to amplify an RF signal 34 based on an envelope tracking (ET) modulated voltage $V_{CC}$. In a non-limiting example, the RF signal 34 is associated with a time-variant input power $P_{IN}$. In this regard, the ET modulated voltage $V_{CC}$ needs to vary in accordance to the time-variant input power $P_{IN}$ such that the amplifier circuit 32 can amplify the RF signal 34 to a time-variant output power $P_{OUT}$ that is linearly related to the time-variant input power $P_{IN}$.

In such wireless communication systems as long-term evolution (LTE) and fifth-generation new-radio (5G-NR), the RF signal 34 may exhibit a very high peak-to-average ratio (PAR). As such, the time-variant input power $P_{IN}$ may increase or decrease drastically from time to time. In this regard, given that an electrical current in the amplifier circuit 32 may be constant, the ET modulated voltage $V_{CC}$ may need to rise or fall drastically from time to time as well. However, when the ET modulated voltage $V_{CC}$ falls below a certain threshold, the amplifier circuit 32 may suffer degraded linearity, thus compromising efficiency and performance of the amplifier circuit 32.

Notably, the output power $P_{OUT}$ of the RF signal 34 may be dependent on the ET modulated voltage $V_{CC}$ and a load impedance $Z_{LOAD}$ of the amplifier circuit 32, as shown in the equation below (Eq. 1).

$$P_{OUT} = \frac{|V_{CC}|^2}{|Z_{LOAD}|^2} \times R \qquad \text{(Eq. 1)}$$

According to the equation (Eq. 1) above, the output power $P_{OUT}$ is positively related to the ET modulated voltage $V_{CC}$ and inversely related to the load impedance $Z_{LOAD}$ of the amplifier circuit 32. As such, when the input power $P_{IN}$ falls, it may be possible to increase the load impedance $Z_{LOAD}$, while maintaining the ET modulated voltage $V_{CC}$, to cause the output power $P_{OUT}$ to track the input power $P_{IN}$. As a result, it may be possible to mitigate linearity degradation in the amplifier circuit 32 to help improve efficiency and performance of the amplifier circuit 32.

In this regard, the MEMS switching circuit 10 may be employed in an apparatus (e.g., a wireless communication device) to enable load-line switching in the amplifier circuit 32. In a non-limiting example, the controller 28 may receive an impedance indication signal 36 indicative of the load impedance $Z_{LOAD}$ in a future temporal period(s) (e.g., a future timeslot(s) or a future sub-frame(s)). Accordingly, the controller 28 toggles the selected MEMS switch based on the determined switching sequence to cause the load impedance $Z_{LOAD}$ in the amplifier circuit 32 in the future temporal period(s).

Figure 2:
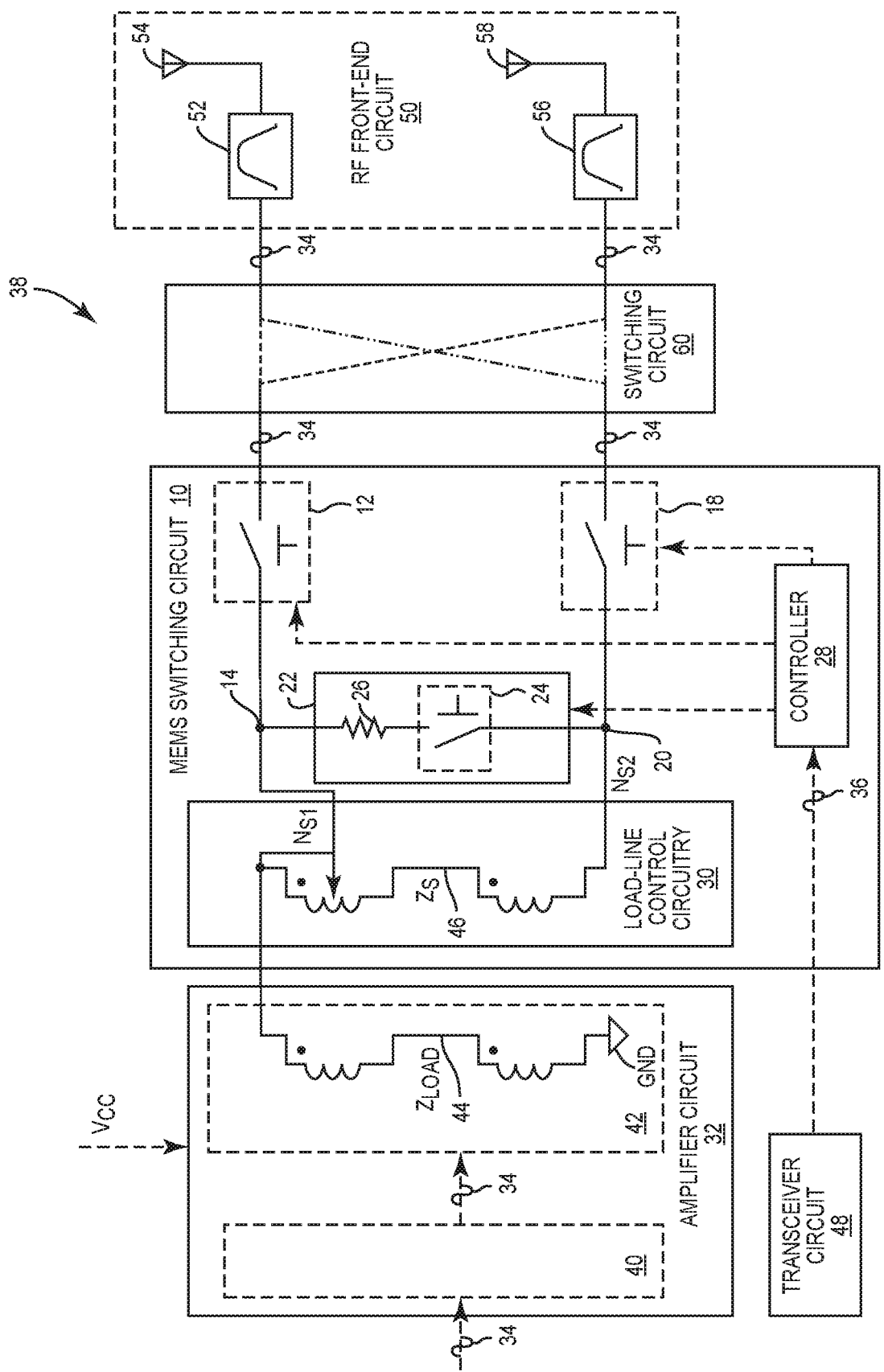
FIG. 2 is a schematic diagram of an exemplary apparatus employing the MEMS switching circuit of FIG. 1 to enable dynamic load-line switching.

FIG. 2 is a schematic diagram of an exemplary apparatus 38 employing the MEMS switching circuit 10 of FIG. 1 to enable dynamic load-line switching in the amplifier circuit 32. Common elements between FIGS. 1 and 2 are shown therein with common element numbers and will not be re-described herein.

The amplifier circuit 32 may include a driver stage amplifier 40 and an output stage amplifier 42. The output stage amplifier 42 includes an output transformer 44. The load-line control circuitry 30 includes a coupling transformer 46 coupled between the first coupling node 14 and the second coupling node 20. The first coupling node 14 may correspond to a first number of turns ($N_{S1}$) of the coupling transformer 46 and the second coupling node may correspond to a second number of turns ($N_{S2}$) of the coupling transformer 46. In a non-limiting example, $N_{S1}$ is smaller than $N_{S2}$ ($N_{S1} < N_{S2}$). In examples discussed below, the controller 28 is configured to enable load-line switching by toggling the first MEMS switch 12 and/or the second MEMS switch 18 in response to the impedance indication signal 36 to cause the load impedance $Z_{LOAD}$ in the output stage amplifier 42 to increase or decrease. In a non-limiting example, the controller 28 receives the impedance indication signal 36 from a transceiver circuit 48.

Given that the output transformer 44 and the coupling transformer 46 are provided in parallel to each other, the output transformer 44 and the coupling transformer 46 may function as a primary transformer and a secondary transformer, respectively. As such, the output transformer 44 and the coupling transformer 46 may enable impedance transformation based on the equation (Eq. 2) below.

$$\sqrt{\frac{Z_{LOAD}}{Z_S}} = \frac{N_P}{N_S} \quad \text{(Eq. 2)}$$

In the equations above, $N_P$ and $N_S$ represent a number of turns in the output transformer 44 and the coupling transformer 46, respectively. $Z_S$ represents impedance of the coupling transformer 46. Based on the equation (Eq. 2), the load impedance $Z_{LOAD}$ can be further expressed in equation (Eq. 3) below.

$$Z_{LOAD} = \left(\frac{N_P}{N_S}\right)^2 \times Z_S \quad \text{(Eq. 3)}$$

As shown in the equation (Eq. 2) above, the load impedance $Z_{LOAD}$ can be indirectly affected by changing the $N_S$ of the coupling transformer 46. In this regard, reducing the $N_S$ in the coupling transformer 46 may cause the load impedance $Z_{LOAD}$ to increase. In contrast, increasing the $N_S$ in the coupling transformer 46 may cause the load impedance $Z_{LOAD}$ to decrease. Accordingly, when the controller 28 closes the first MEMS switch 12 and opens the second MEMS switch 18, the load impedance $Z_{LOAD}$ may be determined based on the equation (Eq. 3.1) below.

$$Z_{LOAD} = \left(\frac{N_P}{N_{S1}}\right)^2 \times Z_S \quad \text{(Eq. 3.1)}$$

In contrast, when the controller 28 opens the first MEMS switch 12 and closes the second MEMS switch 18, the load impedance $Z_{LOAD}$ may be determined based on the equation (Eq. 3.2) below.

$$Z_{LOAD} = \left(\frac{N_P}{N_{S2}}\right)^2 \times Z_S \quad \text{(Eq. 3.2)}$$

Given that $N_{S1} < N_{S2}$, the load impedance $Z_{LOAD}$ increases when the controller 28 closes the first MEMS switch 12 and opens the second MEMS switch 18. In contrast, the load impedance $Z_{LOAD}$ decreases when the controller 28 opens the first MEMS switch 12 and closes the second MEMS switch 18.

In addition to enabling load-line switching in the amplifier circuit 32, the MEMS switching circuit 10 may also be configured to enable RF band selection in an RF front-end circuit 50. In a non-limiting example, the RF front-end circuit 50 includes a first RF filter(s) 52 coupled to a first antenna(s) 54 and a second RF filter(s) 56 coupled to a second antenna(s) 58. The first RF filter(s) 52 is configured to pass the RF signal 34 in a first RF band(s) and the second RF filter(s) 56 is configured to pass the RF signal 34 in a second RF band(s).

The MEMS switching circuit 10 may be coupled to the RF front-end circuit 50 via a switching circuit 60. Accordingly, the apparatus 38 may be configured to pass the RF signal 34 to the first RF filter(s) 52 and/or the second RF filter(s) 56 via the first MEMS switch 12, concurrent to increasing the load impedance $Z_{LOAD}$ in the amplifier circuit 32. Alternatively, the apparatus 38 may be configured to pass the RF signal 34 to the first RF filter(s) 52 and/or the second RF filter(s) 56 via the second MEMS switch 18, concurrent to reducing the load impedance $Z_{LOAD}$ in the amplifier circuit 32.

Figure 3:
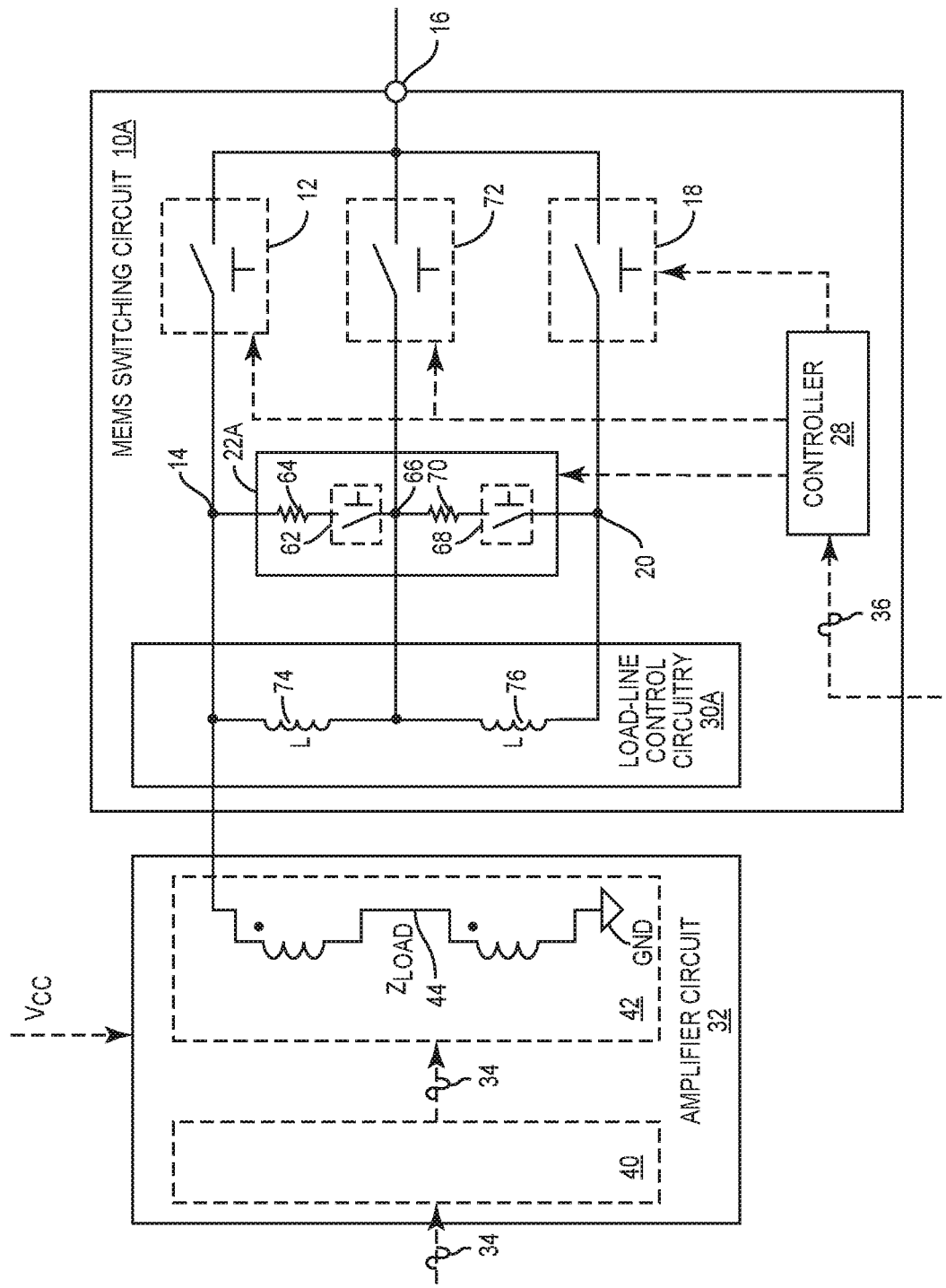
FIG. 3 is a schematic diagram of an exemplary MEMS switching circuit configured according to another embodiment of the present disclosure.

The MEMS switching circuit 10 may be configured based on a number of alternative configurations. In this regard, FIG. 3 is a schematic diagram of an exemplary MEMS switching circuit 10A configured according to another embodiment of the present disclosure. Common elements between FIGS. 1, 2, and 3 are shown therein with common element numbers and will not be re-described herein.

The MEMS switching circuit 10A includes protection circuitry 22A and load-line control circuitry 30A. The protection circuitry 22A includes a first protection MEMS switch 62 and a first protection resistor 64 coupled in series between the first coupling node 14 and at least one third coupling node 66. The protection circuitry 22A also includes a second protection MEMS switch 68 and a second protection resistor 70 coupled in series between the third coupling node 66 and the second coupling node 20.

The MEMS switching circuit 10A includes at least one third MEMS switch 72 coupled between the third coupling node 66 and the output node 16, in parallel to the first MEMS switch 12 and the second MEMS switch 18. The load-line control circuitry 30A includes a first inductor 74 and a second inductor 76 coupled in series. The first inductor 74 is coupled between the first coupling node 14 and the third coupling node 66. The second inductor 76 is coupled between the third coupling node 66 and the second coupling node 20.

Figure 4:
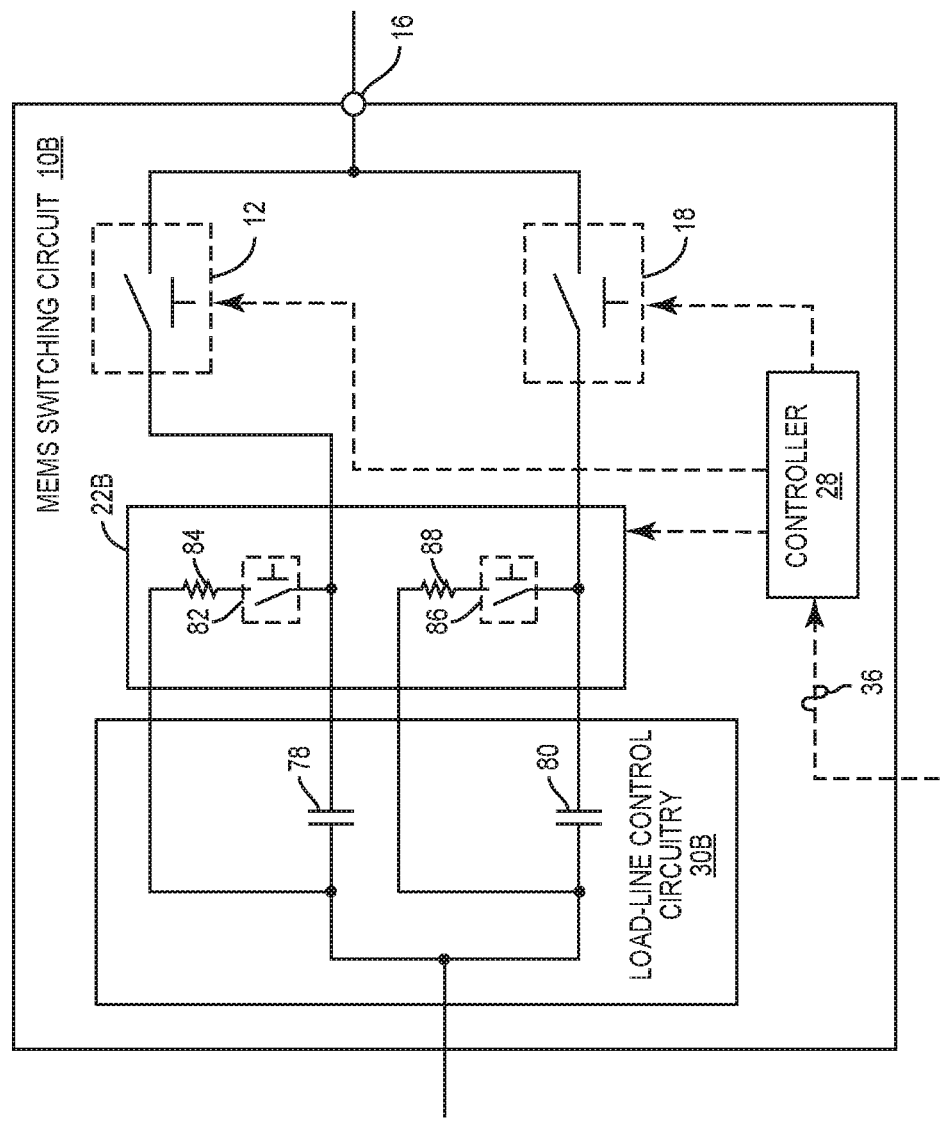
FIG. 4 is a schematic diagram of an exemplary MEMS switching circuit configured according to another embodiment of the present disclosure.

FIG. 4 is a schematic diagram of an exemplary MEMS switching circuit 10B configured according to another embodiment of the present disclosure. Common elements between FIGS. 1, 2, and 4 are shown therein with common element numbers and will not be re-described herein.

The MEMS switching circuit 10B includes protection circuitry 22B and load-line control circuitry 30B. The load-line control circuitry 30B includes at least one first capacitor 78 and at least one second capacitor 80. The protection circuitry 22B includes at least one first protection MEMS switch 82 coupled in series to at least one first protection resistor 84. The first protection MEMS switch 82 and the first protection resistor 84 are coupled in parallel to the first capacitor 78. The protection circuitry 22B includes at least one second protection MEMS switch 86 coupled in series to at least one second protection resistor 88. The second protection MEMS switch 86 and the second protection resistor 88 are coupled in parallel to the second capacitor 80.

Those skilled in the art will recognize improvements and modifications to the embodiments of the present disclosure. All such improvements and modifications are considered within the scope of the concepts disclosed herein and the claims that follow.

What is claimed is:

1. A microelectromechanical systems (MEMS) switching circuit comprising:
    at least one first MEMS switch coupled between at least one first coupling node and an output node;
    at least one second MEMS switch coupled between at least one second coupling node and the output node in parallel to the at least one first MEMS switch;
    protection circuitry comprising at least one protection MEMS switch coupled between the at least one first coupling node and the at least one second coupling node; and
    a controller configured to toggle at least one selected MEMS switch among the at least one first MEMS switch and the at least one second MEMS switch without causing hot switching in the at least one first MEMS switch, the at least one second MEMS switch, and the at least one protection MEMS switch.

2. The MEMS switching circuit of claim 1 wherein the controller is further configured to:
    store a switching sequence for toggling the at least one selected MEMS switch without causing hot switching in the at least one first MEMS switch, the at least one second MEMS switch, and the at least one protection MEMS switch; and
    toggle the at least one selected MEMS switch based on the switching sequence.

3. The MEMS switching circuit of claim 2 wherein the controller is further configured to store the switching sequence determined to toggle each of the at least one first MEMS switch, the at least one second MEMS switch, and the at least one protection MEMS switch with a very low current and/or a very low voltage.

4. The MEMS switching circuit of claim 1 wherein, to toggle the at least one second MEMS switch as the at least one selected MEMS switch, the controller is further configured to:
    close the at least one protection MEMS switch while keeping the at least one first MEMS switch closed and the at least one second MEMS switch open;
    close the at least one second MEMS switch while keeping the at least one first MEMS switch and the at least one protection MEMS switch closed;
    open the at least one first MEMS switch while keeping the at least one second MEMS switch and the at least one protection MEMS switch closed; and
    open the at least one protection MEMS switch while keeping the at least one second MEMS switch closed and the at least one first MEMS switch open.

5. The MEMS switching circuit of claim 1 wherein, to toggle the at least one first MEMS switch as the at least one selected MEMS switch, the controller is further configured to:
    close the at least one protection MEMS switch while keeping the at least one second MEMS switch closed and the at least one first MEMS switch open;
    close the at least one first MEMS switch while keeping the at least one second MEMS switch and the at least one protection MEMS switch closed;
    open the at least one second MEMS switch while keeping the at least one first MEMS switch and the at least one protection MEMS switch closed; and
    open the at least one protection MEMS switch while keeping the at least one first MEMS switch closed and the at least one second MEMS switch open.

6. The MEMS switching circuit of claim 1 wherein the protection circuitry further comprises at least one protection resistor coupled in series to the at least one protection MEMS switch between the at least one first coupling node and the at least one second coupling node.

7. The MEMS switching circuit of claim 1 further comprising load-line control circuitry coupled to the at least one first coupling node, the at least one second coupling node, and an amplifier circuit, wherein the controller is further configured to toggle the at least one selected MEMS switch to cause a load impedance change in the amplifier circuit.

8. An apparatus comprising:
    an amplifier circuit configured to amplify a radio frequency (RF) signal based on a modulated voltage; and
    a microelectromechanical systems (MEMS) switching circuit coupled to the amplifier circuit and comprising:
        at least one first MEMS switch coupled between at least one first coupling node and an output node;
        at least one second MEMS switch coupled between at least one second coupling node and the output node in parallel to the at least one first MEMS switch;
        protection circuitry comprising at least one protection MEMS switch coupled between the at least one first coupling node and the at least one second coupling node; and
        a controller configured to toggle at least one selected MEMS switch among the at least one first MEMS switch and the at least one second MEMS switch without causing hot switching in the at least one first MEMS switch, the at least one second MEMS switch, and the at least one protection MEMS switch.

9. The apparatus of claim 8 wherein the controller is further configured to:
    store a switching sequence for toggling the at least one selected MEMS switch without causing hot switching in the at least one first MEMS switch, the at least one second MEMS switch, and the at least one protection MEMS switch; and
    toggle the at least one selected MEMS switch based on the switching sequence.

10. The apparatus of claim 9 wherein the controller is further configured to store the switching sequence determined to toggle each of the at least one first MEMS switch, the at least one second MEMS switch, and the at least one protection MEMS switch with a very low current and/or a very low voltage.

11. The apparatus of claim 8 wherein, to toggle the at least one second MEMS switch as the at least one selected MEMS switch, the controller is further configured to:
- close the at least one protection MEMS switch while keeping the at least one first MEMS switch closed and the at least one second MEMS switch open;
- close the at least one second MEMS switch while keeping the at least one first MEMS switch and the at least one protection MEMS switch closed;
- open the at least one first MEMS switch while keeping the at least one second MEMS switch and the at least one protection MEMS switch closed; and
- open the at least one protection MEMS switch while keeping the at least one second MEMS switch closed and the at least one first MEMS switch open.

12. The apparatus of claim 8 wherein, to toggle the at least one first MEMS switch as the at least one selected MEMS switch, the controller is further configured to:
- close the at least one protection MEMS switch while keeping the at least one second MEMS switch closed and the at least one first MEMS switch open;
- close the at least one first MEMS switch while keeping the at least one second MEMS switch and the at least one protection MEMS switch closed;
- open the at least one second MEMS switch while keeping the at least one first MEMS switch and the at least one protection MEMS switch closed; and
- open the at least one protection MEMS switch while keeping the at least one first MEMS switch closed and the at least one second MEMS switch open.

13. The apparatus of claim 8 wherein the protection circuitry further comprises at least one protection resistor coupled in series to the at least one protection MEMS switch between the at least one first coupling node and the at least one second coupling node.

14. The apparatus of claim 8 wherein the MEMS switching circuit further comprises load-line control circuitry coupled to the at least one first coupling node, the at least one second coupling node, and the amplifier circuit, wherein the controller is further configured to toggle the at least one selected MEMS switch to cause a load impedance change in the amplifier circuit.

15. The apparatus of claim 14 wherein:
the amplifier circuit comprises an output transformer;
the load-line control circuitry comprises a coupling transformer coupled between the at least one first coupling node and the at least one second coupling node;
the at least one first coupling node corresponds to a first number of turns of the coupling transformer; and
the at least one second coupling node corresponds to a second number of turns of the coupling transformer, wherein the second number of turns is greater than the first number of turns.

16. The apparatus of claim 15 wherein the controller is further configured to:
- close the at least one first MEMS switch and open the at least one second MEMS switch to cause the amplifier circuit to increase load impedance; and
- close the at least one second MEMS switch and open the at least one first MEMS switch to cause the amplifier circuit to reduce load impedance.

17. The apparatus of claim 14 wherein:
the amplifier circuit comprises an output transformer; and
the load-line control circuitry comprises:
- a first inductor coupled to the at least one first coupling node and at least one third coupling node; and
- a second inductor coupled to the at least one third coupling node and the at least one second coupling node.

18. The apparatus of claim 17 wherein the MEMS switching circuit further comprises at least one third MEMS switch coupled between the at least one third coupling node and the output node in parallel to the at least one first MEMS switch and the at least one second MEMS switch.

19. The apparatus of claim 18 wherein the at least one protection MEMS switch comprises:
- a first protection MEMS switch and a first protection resistor coupled in series between the at least one first coupling node and the at least one third coupling node; and
- a second protection MEMS switch and a second protection resistor coupled in series between the at least one third coupling node and the at least one second coupling node.

20. The apparatus of claim 14 wherein:
the load-line control circuitry comprises at least one first capacitor and at least one second capacitor; and
the protection circuitry comprises:
- at least one first protection MEMS switch coupled in series to at least one first protection resistor, wherein the at least one first protection MEMS switch and the at least one first protection resistor are coupled in parallel to the at least one first capacitor; and
- at least one second protection MEMS switch coupled in series to at least one second protection resistor, wherein the at least one second protection MEMS switch and the at least one second protection resistor are coupled in parallel to the at least one second capacitor.

* * * * *